US007682690B2

(12) United States Patent
Bunyan et al.

(10) Patent No.: US 7,682,690 B2
(45) Date of Patent: Mar. 23, 2010

(54) THERMAL MANAGEMENT MATERIALS HAVING A PHASE CHANGE DISPERSION

(75) Inventors: Michael H. Bunyan, Chelmsford, MA (US); Kent M. Young, Carlisle, MA (US)

(73) Assignee: Parker-Hannifin Corporation, Cleveland, OH (US)

( * ) Notice: Subject to any disclaimer, the term of this patent is extended or adjusted under 35 U.S.C. 154(b) by 0 days.

(21) Appl. No.: 10/277,970

(22) Filed: Oct. 21, 2002

(65) Prior Publication Data
US 2003/0152764 A1 Aug. 14, 2003

Related U.S. Application Data

(60) Provisional application No. 60/354,810, filed on Feb. 6, 2002.

(51) Int. Cl.
B32B 5/16 (2006.01)
B32B 17/10 (2006.01)
B32B 27/00 (2006.01)

(52) U.S. Cl. .................. 428/323; 428/328; 428/329; 428/330; 428/332; 428/334; 428/340; 428/484.1; 428/923

(58) Field of Classification Search ................. 428/323, 428/328, 329, 330, 332, 334, 340, 484, 923
See application file for complete search history.

(56) References Cited

U.S. PATENT DOCUMENTS

| 2,311,526 | A | 2/1943 | Ferguson et al. | |
|---|---|---|---|---|
| 3,332,055 | A | 7/1967 | Bogner | |
| 3,405,066 | A | 10/1968 | McGlee | 336/94 |
| 3,609,104 | A | 9/1971 | Ehrreich et al. | |
| 3,928,907 | A | 12/1975 | Chisholm | 29/527.4 |
| 4,217,320 | A | 8/1980 | Ezis et al. | 264/85 |
| 4,299,715 | A | 11/1981 | Whitfield et al. | 252/74 |
| 4,384,610 | A | 5/1983 | Cook et al. | |
| 4,389,340 | A | 6/1983 | Levy | |
| 4,466,483 | A | 8/1984 | Whitfield et al. | |
| 4,473,113 | A | 9/1984 | Whitfield et al. | |
| 4,487,856 | A | 12/1984 | Anderson et al. | |
| 4,512,388 | A | 4/1985 | Claar et al. | 165/104.11 |
| 4,515,740 | A | 5/1985 | Schuettenberg et al. | 264/50 |
| 4,533,685 | A | 8/1985 | Hudgin et al. | |
| 4,546,411 | A | 10/1985 | Kaufman | |
| 4,561,011 | A | 12/1985 | Kohara et al. | |
| 4,575,432 | A | 3/1986 | Lin et al. | |
| 4,602,678 | A | 7/1986 | Fick | 165/79 |
| 4,654,754 | A | 3/1987 | Daszkowski | |
| 4,685,987 | A | 8/1987 | Fick | |
| 4,722,960 | A | 2/1988 | Dunn et al. | |
| 4,755,249 | A | 7/1988 | DeGree et al. | |
| 4,764,845 | A | 8/1988 | Artus | |
| 4,782,893 | A | 11/1988 | Thomas | |
| 4,842,911 | A | 6/1989 | Fick | 428/40.4 |
| 4,855,002 | A | 8/1989 | Dunn et al. | |
| 4,869,954 | A | 9/1989 | Squitieri | 442/13 |
| 4,915,167 | A | 4/1990 | Altoz | |
| 4,965,699 | A | 10/1990 | Jorden et al. | |
| 4,974,119 | A | 11/1990 | Martin | |
| 4,979,074 | A | 12/1990 | Morley et al. | |
| 5,052,481 | A | 10/1991 | Horvath et al. | |
| 5,060,114 | A | 10/1991 | Feinberg et al. | |
| 5,061,549 | A | 10/1991 | Shores | 428/209 |
| 5,094,769 | A | 3/1992 | Anderson, Jr. et al. | 252/74 |
| 5,137,959 | A | 8/1992 | Block et al. | |
| 5,167,851 | A | 12/1992 | Jamison et al. | 252/71 |
| 5,170,930 | A | 12/1992 | Dolbear et al. | |
| 5,194,480 | A | 3/1993 | Block et al. | |
| 5,213,704 | A | 5/1993 | Anderson, Jr. et al. | 252/75 |
| 5,213,868 | A | 5/1993 | Liberty et al. | |
| 5,223,747 | A | 6/1993 | Tschulena | 257/113 |
| 5,248,476 | A | 9/1993 | Slattery et al. | |
| 5,250,209 | A | 10/1993 | Jamison et al. | 252/74 |

(Continued)

FOREIGN PATENT DOCUMENTS

| EP | 1 067 164 A1 | 10/2001 |
|---|---|---|
| EP | 1 143 511 A2 * | 10/2001 |
| EP | 1 143 512 A2 | 10/2001 |
| EP | 1 291 913 A2 * | 3/2003 |
| EP | 1 291 913 A2 | 12/2003 |
| WO | 96/37915 | 11/1996 |
| WO | 00/36893 | 6/2000 |

OTHER PUBLICATIONS

AI Technology Data Sheet for Cool-Pad TP7609, revised Aug. 12. 2000.
AI Technology Data Sheet for Cool-Pad TP7105, revised Feb. 1992.
AI Technology Data Sheet for Cool-Pad TP7208, revised Feb. 1992.
AI Technology Data Sheet for Cool-Paid TP7205, revised Feb. 1992.
AI Technology Data Sheet for Cool-Pad TP7608, revised Feb. 1992.

(Continued)

Primary Examiner—Sheeba Ahmed
(74) Attorney, Agent, or Firm—John A. Molnar, Jr.

(57) ABSTRACT

A thermally-conductive interface interposable intermediate a first heat transfer surface and an opposing second heat transfer surface to provide a thermal pathway therebetween. The interface includes a thermally-conductive compound formed into a layer which is conformable between the first and second heat transfer surface. The compound is an admixture of: (a) a polymeric constituent forming a continuous matrix in the layer; and (b) a dispersed constituent forming discrete domains within the matrix, the domains being form-stable at normal room temperature in a first domain phase and conformable between the first and second heat transfer surface in a second domain phase, and the domains having a domain transition temperature above normal room temperature from the first domain phase to the second domain phase. The dispersed constituent may be a fusible, i.e., low temperature melting, metal or metal alloy.

24 Claims, 3 Drawing Sheets

U.S. PATENT DOCUMENTS

| | | | |
|---|---|---|---|
| 5,291,371 A | 3/1994 | Gruber et al. | |
| 5,298,791 A | 3/1994 | Liberty et al. | |
| 5,302,344 A | 4/1994 | Perlman | |
| 5,321,882 A | 6/1994 | Zaroui et al. | |
| 5,328,087 A | 7/1994 | Nelson et al. | |
| 5,352,731 A | 10/1994 | Nakano et al. | |
| 5,372,883 A | 12/1994 | Shores | 428/323 |
| 5,445,308 A | 8/1995 | Nelson et al. | |
| 5,471,027 A | 11/1995 | Call et al. | 219/85.13 |
| 5,533,256 A | 7/1996 | Call et al. | 29/840 |
| 5,545,473 A | 8/1996 | Ameen et al. | 428/212 |
| 5,580,520 A | 12/1996 | Slattery et al. | |
| 5,602,221 A | 2/1997 | Bennett et al. | |
| 5,679,457 A | 10/1997 | Bergerson | 428/344 |
| 5,770,318 A | 6/1998 | Friedman | |
| 5,781,412 A | 7/1998 | DeSorgo | 361/704 |
| 5,783,862 A | 7/1998 | Deeney | |
| 5,796,582 A | 8/1998 | Katchmar | |
| 5,798,171 A | 8/1998 | Olson | |
| 5,930,893 A | 8/1999 | Eaton | 29/890.03 |
| 5,944,322 A | 8/1999 | Coff et al. | |
| 5,950,066 A | 9/1999 | Hanson et al. | 428/551 |
| 5,994,020 A | 11/1999 | Patel et al. | 430/137.14 |
| 6,037,658 A | 3/2000 | Brodsky et al. | 257/707 |
| 6,054,198 A | 4/2000 | Bunyan et al. | 428/40.5 |
| 6,080,800 A | 6/2000 | Frey et al. | 521/132 |
| 6,090,484 A | 7/2000 | Bergerson | 428/355 EN |
| 6,197,859 B1 | 3/2001 | Green et al. | |
| 6,202,739 B1 | 3/2001 | Pal et al. | 165/104.33 |
| 6,339,120 B1 | 1/2002 | Misra et al. | 524/404 |
| 6,339,130 B1 | 1/2002 | Bennett et al. | 525/415 |
| 6,372,997 B1 | 4/2002 | Hill et al. | |
| 6,391,442 B1 | 5/2002 | Duvall et al. | 428/348 |
| 6,620,515 B2 | 9/2003 | Feng et al. | |
| 7,074,490 B2 | 7/2006 | Feng et al. | |

OTHER PUBLICATIONS

Article authored by L.M Leung and K. K. T. Chung entitled Zero-stress Film Adhesive for Substrate Attach, published in Hybrid Circuits No. 18, Jan. 1989.
AI Technology Data Sheet for Thermoplastic TP7165, revised Oct. 1994.
AI Technology Data Sheet for Cool-Pad TP7605, revised Oct. 1994.
AI Technology Invoice No. 6420 dated Feb. 12, 1993.
Material Safety Data MSDS No. 320—CSL 850 Heat Sink Compound—revised May 12, 2000.
CSL Silicones, Inc., CSL-850 Technical Data Sheet © 1999.
CHO-LUBE® Electrically Conductive Grease. Applicants request the Examiner to consider this reference as prio art under 102(a), however, Applicants respectfully reserve the right to supplement this Information Disclosure Statement and take a contrary position should it be necessary.
International Search Report in PCT Application No. PCT/IB97/00223.
Transmittal of International Search Report or the Declaration in corresponding International Application No. PCT/US02/33934.
International Application Published Under the Patent Cooperation Treaty No. WO 96/37915.
International Application Published Under the Patent Cooperation Treaty No. WO 97/41599.
Article entitled Thermally Conductive Adhesives for Electronic Packaging, authored by Carol Latham, President of Thermagon. Inc. dated Jul. 1991.
Letter dated Jul. 25, 2000 from Eugene Lieberstein of Anderson Kill & Olick, P.C.
Invoices dated May 15, 1992 and Jul. 6, 1993 of Thermagon, Inc.
Technical Data Sheet Ablefilm™ 5025E, dated Mar. 1992 of Ablestik, entitled Electrically Conductive Adhesive Flm.
Technical Data Sheet Ablefilm™ 563K, dated Nov. 1995 of Ablestik, entitled Thermally Conductive Adhesive Film.
Technical Data Sheet Ablefilm™ 566K, dated Nov. 1995 of Ablestik, entitled Low Temperature Cure Adhesive Film.
Article entitled T-gon 100 Series, Thermally Conductive Epoxy Adhesive Films, dated Jun. 10, 1997 of Thermagon, Inc.
AI Technology Data Sheet for Cool-Pad TP7208, revised Feb. 1992.
AI Technology Data Sheet for Cool-Paid TP7205, revised Febrary, 192.
AI Technology Data Sheet for Cool-Pad TP7609, revised Aug. 12, 2000.
Article authored by L.M Leung and K. K. T. Chung entitled Zero-stress Film Adhesive for Substrate Attach, published in Hybrid Circuits No. 18, Jan. 1989.
Letter dated Aug. 17, 2000 from Clement A. Berard of Dann, Dorfman, Herrell & Skillman.
Thermal Products Group—Grease Replacement Products to Support Pentium and Pentium II Applications Sep. 16, 1998.
IBM Technical Disclosure Bulletin, vol. 25, No. 11A Apr. 1983 Flexible Heat-Conducting Sheet Material for Semiconductor Packages, R. H. Lacombe and H. Lee.
IBM Technical Disclosure Bulletin, vol. 24, No. 12 May 1982 Chip Cooling Employing Alloys Having Different Solidus Temperatures, J. K. Hassan, S. Oktay and J. Paivanas.
IBM Technical Disclosure Bulletin, vol. 27, No. 7A Dec. 1984 Cooling Assembly for Solder-Bonded Semiconductor Devices—J. L. Horvath.
IBM Technical Disclosure Bulletin, vol. 35, No. 7 Dec. 1992 Thermally Conductive, Reworkable, Elastomeric Interposer for Chip-to-Heat Sink Attachment.
AI Technology Invoice No. 6420 dated Feb. 12, 1993.
AI Technology Invoice No. 7344 dated Aug. 27, 1993.
AI Technology Invoice No. 5657 dated Sep. 14, 1992.
AI Technology Invoice No. 4580 dated Mar. 24, 1993.
AI Technology Invoice No. 5370 dated Jul. 27, 1992.
AI Technology Invoice No. 4964 dated May 27, 1992.
AI Technology Invoice No. 8303 dated Mar. 18, 1994.
AI Technology Invoice No. 8789 dated Jul. 18, 1994.
Orcus inc. Thermaphase—Thermal Interface Materials for Electronics: Unique Characteristics, Lowest Thermal Resistance.
Technical Bulletin #77 Chomerics—Cho-Therm Thermal Interface Materials 1997.
Technical Bulletin #78 Chomerics—CMO-Therm Thermal Interface Materials 1998.
*Packaging Ideas*, Edited by Howard Markstein, Interface Materials Offer Heat Tranefer and Isolation.
Earl's Pressure Master—Engine Gaskets Seals—1996 Earl's Performance Products.
Unisys Systems Technology Operations ThEn Foam Constituents and Application Guide.
Alchemy Fusible Alloys dated Mar. 1, 2001.
Standard Specification for Low Melting Point Alloys, Designation: B 774-00.
Chomerics' Test Report—Comparison of Thermal Grease and Thermflow™ T707/T710 on a Leading Manufacturer's Tower PC.
Chomerica' Test Report—Typical Application Test Results for Thermflow™ T725 Material, dated Jan. 5, 2000.
Chomerics' Thermflow™ T725 Material Application Guidelines.
Chomerics' Preliminary Product Data Sheet for Thermflow™ T766.
Chomerics' Technical Bulletin 77 for Thermflow™ Low Thermal Phase Resistace Phase-Change Interface Pads, dated 1999.
Bergquist Hi-Flow™ —The Grease Replacement Material With Thermal Resistance Equal to Grease—dated Jul. 6, 2001.
Thermflow™ Phase-Change Materials dated Oct. 1999.
Dow Corning Product Information for Thermally Conductive Materials © 2000,2001.
US 5,654,754, 03/1987, Daszkowski (withdrawn)

* cited by examiner

THERMAL MANAGEMENT MATERIALS HAVING A PHASE CHANGE DISPERSION

CROSS-REFERENCE TO RELATED CASES

The present application claims the benefit of the filing date of U.S. Provisional Application Ser. No. 60/354,810; filed Feb. 6, 2002, the disclosure of which is expressly incorporated herein by reference.

BACKGROUND OF THE INVENTION

The present invention relates broadly to thermal management materials for electronic devices. Such materials commonly are used as heat transfer interfaces between, for example, the mating heat transfer surfaces of a heat-generating, electronic component, such as an integrated circuit (IC) chip, and a thermal dissipation member, such as a heat sink or spreader, for the conductive cooling of the electronic component. More particularly, the present invention relates to a thermally-conductive interface material which is formed as an admixture of a continuous phase constituent and a dispersed phase constituent which is provided to be solid, semi-solid or otherwise form-stable in a first state at normal room temperature but conformable with the continuous phase constituent in a second state within the operating temperature of the electronic component to provide an enhanced low thermal impedance interface between the component and the dissipation member.

Circuit designs for modern electronic devices such as televisions, radios, computers, medical instruments, business machines, communications equipment, and the like have become increasingly complex. For example, integrated circuits have been manufactured for these and other devices which contain the equivalent of hundreds of thousands of transistors. Although the complexity of the designs has increased, the size of the devices has continued to shrink with improvements in the ability to manufacture smaller electronic components and to pack more of these components in an ever smaller area.

As electronic components have become smaller and more densely packed on integrated boards and chips, designers and manufacturers now are faced with the challenge of how to dissipate the heat which is ohmically or otherwise generated by these components. Indeed, it is well known that many electronic components, and especially power semiconductor components such as transistors and microprocessors, are more prone to failure or malfunction at high temperatures. Thus, the ability to dissipate heat often is a limiting factor on the performance of the component.

Electronic components within integrated circuits traditionally have been cooled via forced or convective circulation of air within the housing of the device. In this regard, cooling fins have been provided as an integral part of the component package or as separately attached thereto for increasing the surface area of the package exposed to convectively-developed air currents. Electric fans additionally have been employed to increase the volume of air which is circulated within the housing. For high power circuits and the smaller but more densely packed circuits typical of current electronic designs, however, simple air circulation often has been found to be insufficient to adequately cool the circuit components.

Heat dissipation beyond that which is attainable by simple air circulation may be effected by the direct mounting of the electronic component to a thermal dissipation member such as a "cold plate" or other heat sink or spreader. The dissipation member may be a dedicated, thermally-conductive ceramic or metal plate or finned structure, or simply the chassis or circuit board of the device. However, beyond the normal temperature gradients between the electronic component and the dissipation member, an appreciable temperature gradient is developed as a thermal interfacial impedance or contact resistance at the interface between the bodies.

That is, and as is described in U.S. Pat. No. 4,869,954, the faying thermal interface surfaces of the component and heat sink typically are irregular, either on a gross or a microscopic scale. When the interfaces surfaces are mated, pockets or void spaces are developed therebetween in which air may become entrapped. These pockets reduce the overall surface area contact within the interface which, in turn, reduces the heat transfer area and the overall efficiency of the heat transfer through the interface. Moreover, as it is well known that air is a relatively poor thermal conductor, the presence of air pockets within the interface reduces the rate of thermal transfer through the interface.

To improve the heat transfer efficiency through the interface, a pad or other layer of a thermally-conductive, electrically-insulating material typically is interposed between the heat sink and electronic component to fill in any surface irregularities and eliminate air pockets. Initially employed for this purpose were materials such as silicone grease or wax filled with a thermally-conductive filler such as aluminum oxide. Such materials usually are semi-liquid or solid at normal room temperature, but may liquefy or soften at elevated temperatures to flow and better conform to the irregularities of the interface surfaces.

The greases and waxes of the aforementioned types heretofore known in the art, however, generally are not self-supporting or otherwise form stable at room temperature and are considered to be messy to apply to the interface surface of the heat sink or electronic component. To provide these materials in the form of a film which often is preferred for ease of handling, a substrate, web, or other carrier must be provided which introduces another interface layer in or between which additional air pockets may be formed. Moreover, use of such materials typically involves hand application or lay-up by the electronics assembler which increases manufacturing costs.

Alternatively, another approach is to substitute a cured, sheet-like material in place of the silicone grease or wax. Such materials may be compounded as containing one or more thermally-conductive particulate fillers dispersed within a polymeric binder, and may be provided in the form of cured sheets, tapes, pads, or films. Typical binder materials include silicones, urethanes, thermoplastic rubbers, and other elastomers, with typical fillers including aluminum oxide, magnesium oxide, zinc oxide, boron nitride, and aluminum nitride.

Exemplary of the aforesaid interface materials is an alumina or boron nitride-filled silicone or urethane elastomer which is marketed under the name CHO-THERM® by the Chomerics TEC Division of Parker-Hannifin Corp., 16 Flagstone Drive, Hudson, N.H. 03051. Additionally, U.S. Pat. No. 4,869,954 discloses a cured, form-stable, sheet-like, thermally-conductive material for transferring thermal energy. The material is formed of a urethane binder, a curing agent, and one or more thermally conductive fillers. The fillers, which may include aluminum oxide, aluminum nitride, boron nitride, magnesium oxide, or zinc oxide, range in particle size from about 1-50 microns (0.05-2 mils).

Sheets, pads, and tapes of the above-described types have garnered general acceptance for use as interface materials in the conductive cooling of electronic component assemblies such as the semiconductor chips, i.e., dies, described in U.S. Pat. No. 5,359,768. In certain applications, however, heavy fastening elements such as springs, clamps, and the like are required to apply enough force to conform these materials to the interface surfaces in order to attain enough surface for efficient thermal transfer. Indeed, for some applications, materials such as greases and waxes which liquefy, melt, or soften at elevated temperature continue to be preferred as better conforming to the interface surfaces under relatively low clamping pressures.

Recently, phase-change materials have been introduced which are self-supporting and form-stable at room temperature for ease of handling, but which liquefy or otherwise soften at temperatures within the operating temperature range of the electronic component to form a viscous, thixotropic phase which better conforms to the interface surfaces. These phase-change materials, which may be supplied as free-standing films, or as heated screen printed onto a substrate surface, advantageously function much like greases and waxes in conformably flowing within the operating temperature of the component under relatively low clamping pressures of about 5 psi (35 kPa). Such materials are further described in commonly-assigned U.S. Pat. No. 6,054,198, and are marketed commercially under the names THERM-FLOW® T310, T443, T705, T710, T725, and A725 by the Chomerics TEC Division of Parker-Hannifin Corp., 16 Flagstone Drive, Hudson, N.H. 03051. Other phase-change materials are marketed commercially by the Bergquist Company (Minneapolis, Minn.) under the tradename "HI-FLOW™," by Thermagon, Inc. (Cleveland, Ohio) under the tradenames "T-PCM™" and by Orcus, Inc. (Stilwell, Kans.) under the tradename "THERMAPHASE." A phase-change material/metal foil laminate is marketed by Thermagon, Inc. under the tradename "T-MATE™."

For typical commercial application, the thermal interface material may be supplied in the form of a tape or sheet which includes an inner and outer release liner and an interlayer of thermal compound. Unless the thermal compound is inherently tacky, one side of the compound layer may be coated with a thin layer of a pressure-sensitive adhesive (PSA) for the application of the compound to the heat transfer surface of a heat sink. In order to facilitate automated dispensing and application, the outer release liner and compound interlayer of the tape or sheet may be die cut to form a series of individual, pre-sized pads. Each pad thus may be removed from the inner release liner and bonded to the heat sink using the adhesive layer in a conventional "peel and stick" application which may be performed by the heat sink manufacturer.

With the pad being adhered to the heat transfer surface of the thermal dissipation member such as a heat sink or spreader, and with the outer liner in place to form a protective cover the outer surface of the compound layer, the dissipation member and pad may be provided as an integrated assembly. Prior to installation of the assembly, the outer release liner is removed from the compound layer, and the pad positioned on the electronic component. A clamp may be used to secure the assembly in place.

In view of the foregoing, it will be appreciated that further improvements in thermal management materials would be well-received by electronics manufacturers. Especially desired would be a thermal interface material which can be formed into a pad, sheet, or the like and which offers lower thermal impedance for improved thermal performance.

BROAD STATEMENT OF THE INVENTION

The present invention is directed to a thermally-conductive interface, and a material therefor, for a thermal management assembly involving, for example, a heat source such as an electronic chip or other heat-generating component and a thermal dissipation member such as a heat sink or spreader disposable in thermal adjacency with the electronic component for the conduction of heat therebetween. Particularly, the invention is directed to a material in the form of a thermally-conductive compound which is formable into a sheet, pad, or other layer which is compliant or otherwise conformable between the interfacing surfaces of the electronic component and the heat sink or spreader to provide a low thermal impedance across the assembly, and which affords lower thermal impedance for improved heat transfer performance.

Heretofore, materials of the type herein involved, and particularly those of a phase change variety, conventionally were formulated as a blend of a resin or wax binder and a thermally-conductive, particulate filler which may be one or more metal powders or metal or non-metal nitrides or oxides. Such fillers have a fixed particle size within the material such that the maximum particle size thereof defines the minimum thickness of the material within the interface formed between the respective surfaces of the assembly. Advantageously, it has been observed that by utilizing a thermally-conductive, a phase change material ("PCM") which forms a dispersed phase within a continuous phase of one or more polymeric materials, a thermal interface compound may be formulated which is highly conformable for lower contact resistance, and which the minimum thickness thereof within an interface or bondline need not be determined by the maximum particle size of a filler.

In an illustrative embodiment, the thermally-conductive compound of the present invention is formulated as an admixture of a polymeric component, which itself may be formulated as a blend of one or more resins or waxes, or a mixture of one more resins and one or more waxes, and a fusible, i.e., low temperature melting, metal component, which itself may be formulated as a mixture of one or more fusible metals, one or more fusible metal alloys, or a blend of one or more fusible metals and one or more fusible metal alloys. The fusible metal component and, optionally, the polymeric component each may be phase change materials selected to be form-stable at normal room temperature in a first phase or state, and conformable within the interface in a second phase or state, and as having a transition temperature, such as a melting point ($T_m$) or glass transition ($T_g$) in the case of the polymeric component, and a melting point, solidus, or liquidus in the case of the fusible metal component, or a transition temperature range from the first phase to the second phase which is within the operating temperature range of the electronic component, and typically between about 40-100° C.

Advantageously, the fusible metals and/or alloys herein involved exhibit thermal conductivities on the order of about 20 W/m-K or more which are comparable to those exhibited by conventional metal powder particulate fillers. However, within the interface or bondline, such metals and alloys also are conformable with the polymeric component such that the minimum thickness of the interface material is not limited by a fixed filler particle size. Indeed, it has been observed that such metals and alloys behave within the interface material of the present invention more like the continuous phase than a dispersed filler phase and thereby do not adversely impact the overall melt flow viscosity of the material. In contrast, the use of particulate fillers has been observed to effect a substantial increase of the melt flow viscosity as a result of increased resin demand. Moreover, as compared to the use of a fusible metal or alloy alone as a thermal interface, the composite material of the present invention affords the opportunity, by virtue of the combination of a resin, wax, or other polymeric component with the fusible metal or alloy, to better control melt flow viscosity which otherwise could result in the fusible metal component, which alone may have a relatively low melt flow viscosity, flowing out of the interface with the result of a dry joint and attendantly high thermal resistance.

The present invention, accordingly, comprises the combination of elements which are exemplified in the detailed disclosure to follow. Advantages of the present invention include a thermal interface material which is fully conformable for lowered contact resistance and more efficient heat transfer. Further advantages include a thermal interface material which may be formulated for use in applications requiring thin minimum bondline thicknesses ("MBLT") without the use of thickness-determining particulates or, with or without the addition of such particulates and/or other fillers, for use in thicker bondlines specifying a material having high bulk thermal properties. Still further advantages include a thermal interface material which may be supplied in a sheet, tape, or pad which is form-stable at room temperature for ease of handling and use. These and other advantages will be readily apparent to those skilled in the art based upon the disclosure contained herein.

BRIEF DESCRIPTION OF THE DRAWINGS

For a fuller understanding of the nature and objects of the invention, reference should be had to the following detailed description taken in connection with the accompanying drawings wherein.

Figure 1:
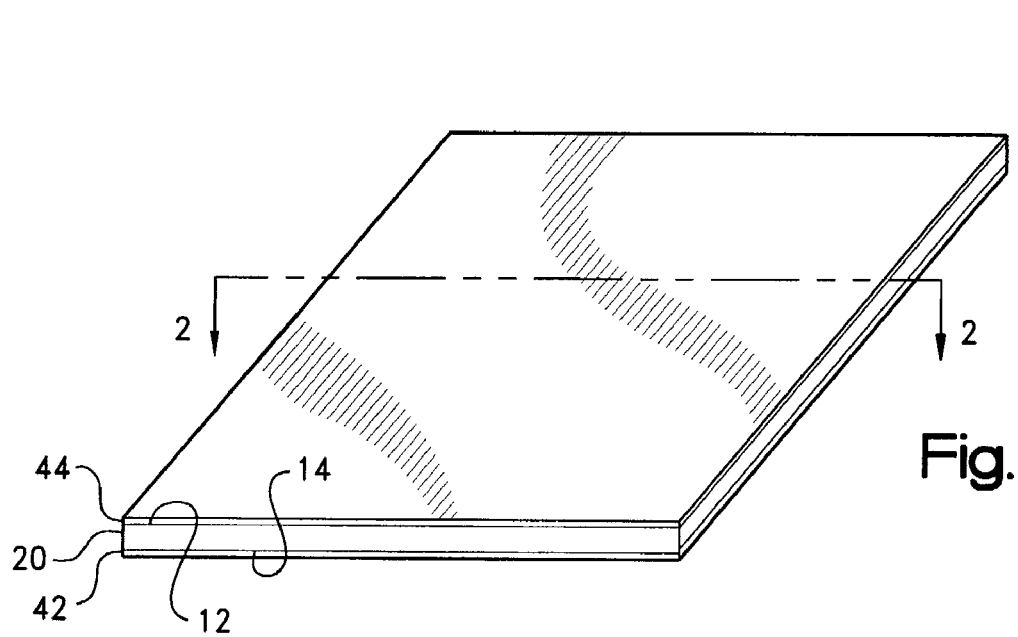
FIG. 1 is a perspective view of a representative thermal interface pad having a conformable layer of a thermally-conductive compound formulated in accordance with the present invention.

The drawings will be described further in connection with the following Detailed Description of the Invention.

DETAILED DESCRIPTION OF THE INVENTION

Certain terminology may be employed in the following description for convenience rather than for any limiting purpose. For example, the terms "forward" and "rearward," "front" and "rear," "right" and "left," "upper" and "lower," "top" and "bottom," and "right" and "left" designate directions in the drawings to which reference is made, with the terms "inward," "inner," "interior," or "inboard" and "outward," "outer," "exterior," or "outboard" referring, respectively, to directions toward and away from the center of the referenced element, the terms "radial" or "vertical" and "axial" or "horizontal" referring, respectively, to directions or planes perpendicular and parallel to the longitudinal central axis of the referenced element, and the terms "downstream" and "upstream" referring, respectively, to directions in and opposite that of fluid flow. Terminology of similar import other than the words specifically mentioned above likewise is to be considered as being used for purposes of convenience rather than in any limiting sense. Also as used herein, "state change" may be used interchangeably with "phase change" to avoid confusion with the description of separate material phases, such as a continuous and a dispersed phase, within a compound or layer thereof.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows.

For the illustrative purposes of the discourse to follow, the thermally-conductive interface and material therefor of the invention herein involved is described in connection with its use within a thermal management assembly as a pad, which may be die or kiss-cut form a sheet or roll, which is adhered to a heat transfer surface of a thermal dissipation member such as a heat sink for heat transfer contact with a mating heat transfer surface of a electronic component. Such assemblies and thermal interface materials therefor are elsewhere described in U.S. Pat. Nos. 6,096,414; 6,054,198; 5,798,171; 5,766,740; 5,679,457; 5,545,473; 5,533,256; 5,510,174; 5,471,027; 5,359,768; 5,321,582; 5,309,320; 5,298,791; 5,250,209; 5,213,868; 5,194,480; 5,137,959; 5,167,851; 5,151,777; 5,060,114; 4,979,074; 4,974,119; 4,965,699; 4,869,954; 4,842,911; 4,782,893; 4,764,845; 4,685,987; 4,654,754; 4,606,962; 4,602,678; 4,473,113; 4,466,483; 4,299,715; and 3,928,907. It will be appreciated, however, that aspects of the present invention, which alternatively may be provided in other roll, sheet, film, or layer form such as a tape, may find use in other thermal management applications. The material of the invention also may be liquid dispensed or otherwise applied in a layer or pattern onto one of the heat transfer surfaces by direct or indirect means such as spraying, knife, roller, drum or other coating, brushing, casting, dipping, extrusion, screen, transfer, or other printing, and the like. Such uses and applications therefore should be considered to be expressly within the scope of the present invention.

Figure 2:
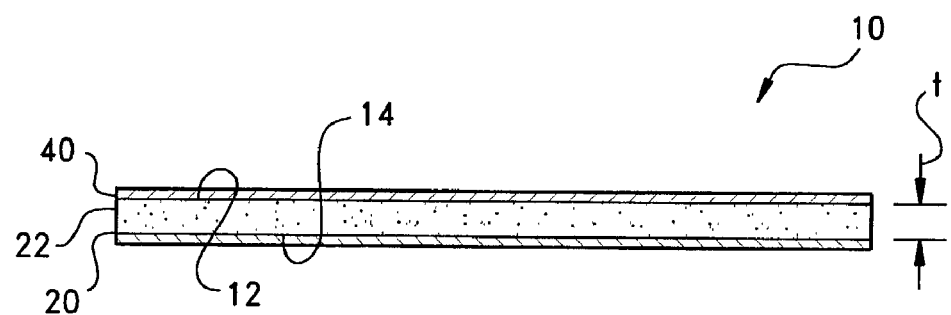
FIG. 2 is a cross-sectional view of the thermal interface pad of FIG. 1 taken through line 2-2 of FIG. 1.

Referring then to the figures wherein corresponding reference characters are used to designate corresponding elements throughout the several views with equivalent elements being referenced with prime or sequential alphanumeric designations, a representative thermally-conductive interface pad in accordance with the present invention is shown generally at 10 in perspective in FIG. 1 and in cross-section in FIG. 2. Within a thermal management assembly, pad 10 is interposable intermediate, for example, a pair of opposing heat transfer surfaces, such as from a heat sink or spreader and a heat-generating electronic component (see FIG. 5) to provide a low impedance, thermally-conductive pathway therebetween. In this regard, a first interface surface, referenced generally at 12, of pad 10 is disposable in conductive heat transfer contact or adjacency with one of the heat transfer surfaces, with an opposing second interface surface, referenced generally at 14, of the pad 10 being disposable in conductive heat transfer contact or adjacency with the other of the heat transfer surfaces.

Pad 10 may be provided in the form of, or as formed from, such as by die or kiss-cutting, a sheet, roll, tape, or the like. In basic composition, pad 10 is formed of a layer, 20, of a thermally-conductive compound formulated in accordance with the precepts of the present invention, which layer 20 forms the surfaces 12 and 14 of the pad 10, and which layer 20 is compliant or otherwise conformable between the heat transfer surfaces of the thermal management assembly. For most applications, compound layer 20 will have thickness, referenced at "t" in FIG. 2, of about 5 mils (125 μm) or less and not greater than about 20 mils (510 μm), and will exhibit a thermal impedance, such as in accordance with ASTM D5470, of between about 0.01-0.02° C.-in$^2$/W (0.065-0.13° C.-cm$^2$/W), and a thermal conductivity, such as also in accordance with ASTM D5470, of at least about 0.7 W/m-K.

Figure 3:
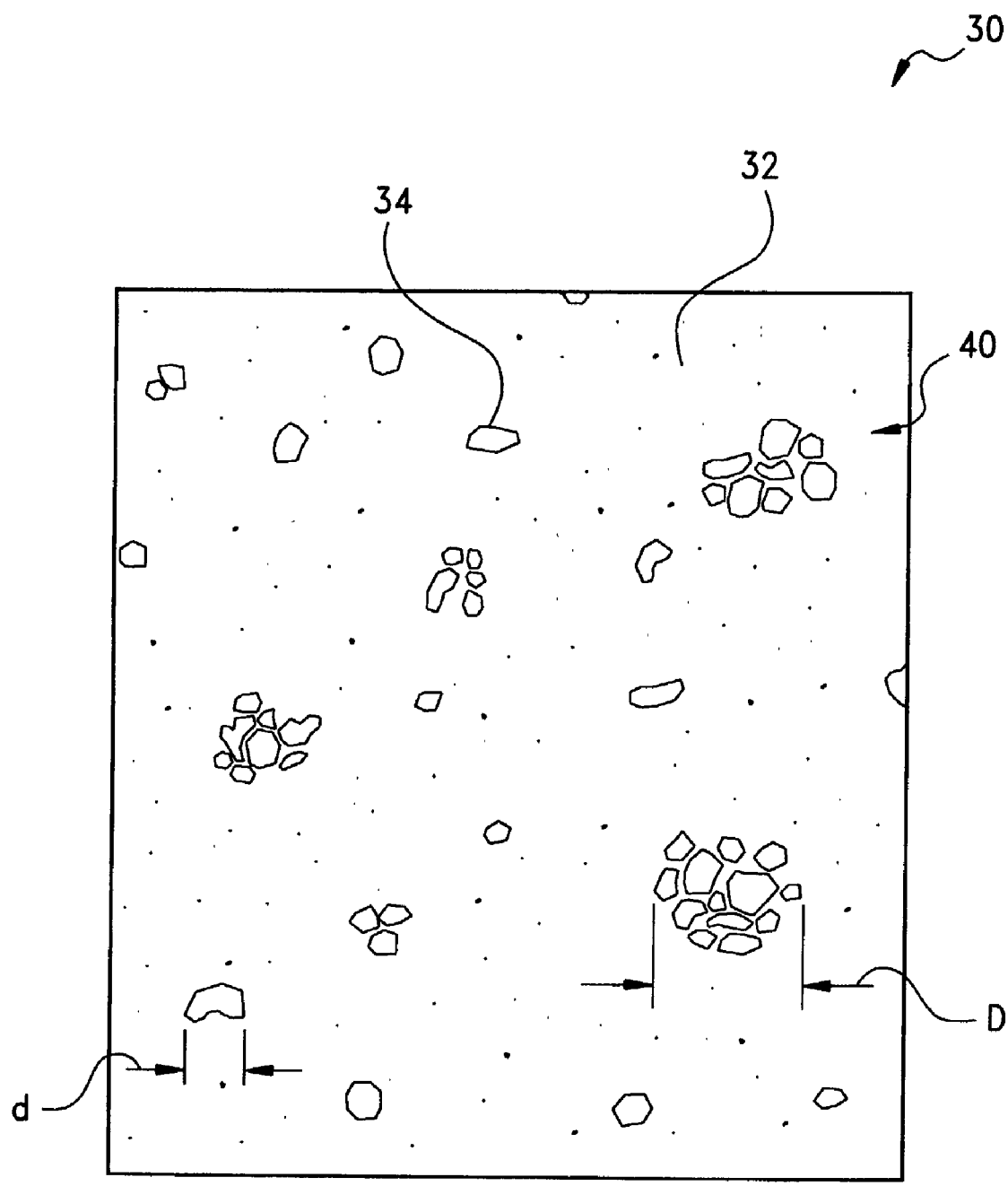
FIG. 3 is a depiction showing the morphology of the thermal compound forming the conformable layer of the thermal interface pad interface of FIG. 1.

In accordance with the present invention, the thermally-conductive compound of the conformable layer 20 is formulated, with reference momentarily to the somewhat stylized morphological, i.e., photomicrographical, depiction of layer 20 which is referenced at 30 in FIG. 3, as a blend or other admixture of a polymeric component or other constituent which forms a continuous matrix phase, 32, in layer 20, and a dispersed phase component or other constituent which forms discrete domains, one of which is referenced at 34, within the matrix phase 32.

Although the polymeric component may be provided as a silicone, polyurethane, acrylic, acrylic pressure-sensitive adhesive (PSA), or other material conventional used for thermal interface materials, the polymeric component alternatively may be formulated as a phase-change material (PCM). By "phase-change," it is meant that the material is form-stable at normal room temperature, i.e., about 25° C., in a solid, semi-solid, glassy, or crystalline first phase or state, but is substantially conformable at an elevated temperature or temperature range in a liquid, semi-liquid, or otherwise viscous second phase or state. Unlike conventional greases or waxes, layer 20 as formulated with such a PCM, advantageously is form-stable at normal room temperature such that pad 10 may be shipped and handled without causing the layer to slump, sag, or run.

The phase transition temperature of the PCM, which may be its melting or glass transition temperature from a form stable first phase to a viscously or viscoelasticly-flowable second phase, is preferably between about 40-80° C., and may be tailored to fall within the operating temperature of most electronic components. Particularly, the polymeric component may be a resin such as: an acrylic, acrylamide, or copolymer or blend thereof, a pressure-sensitive adhesive (PSA), or a thermoplastic hot-melt such as a polyolefin, polyamide, polycarbonate, polyester, ethylene vinyl acetate, polyvinyl acetate, polyimide, or copolymer or blend thereof. Alternatively, the polymeric component may be a resin which is otherwise termed a "wax" such as a paraffinic or other wax, or a blend of one or more of the aforementioned or other resins, or of one or more of the aforementioned or other waxes, or a blend of one or more of such resins and one or more of such waxes. The polymeric component may be formulated to be inherently tacky, such as by control of glass transition temperature, surface energy, viscosity, or other physical or chemical property, to enable one or both of the surfaces 12 and 14 of the layer 20 to be bondable at room temperature under a moderate applied pressure of between about 5-50 psi (35-350 kPa) to the surface of the heat sink, spreader, or the like without the necessity of heating or the provision of a separate pressure-sensitive adhesive (PSA) or other adhesive layer.

In an illustrative embodiment, the PCM of layer 20 may be formulated as a form-stable blend of, by weight of the PCM: (a) between about 25-50% of a PSA component having a melting temperature of between about 90-100° C.; and (b) between about 50-75% of an α-olefinic, thermoplastic component having a melting temperature of between about 30-60° C. "Melting temperature" is used herein in its broadest sense, and as interchangeable with "melting point," "softening temperature," and "softening point" to indicate a transition from a form-stable crystalline or glassy solid phase to a flowable liquid, semi-liquid, or otherwise viscous, thixotropic phase or melt which may be generally characterized as exhibiting intermolecular chain rotation. In this regard, the specified components typically will exhibit the stated softening or melting points as determined by means of differential scanning calorimetry (DSC) or differential thermal analysis (DTA). For amorphous materials not having a clearly defined melting peak, the term melting temperature also is used interchangeably with glass transition point at which the such materials may be characterized as exhibiting intramolecular chain rotation.

The PSA component generally may be of an acrylic-based, hot-melt variety such as a homopolymer, copolymer, terpolymer, interpenetrating network, or blend of an acrylic or (meth)acrylic acid, an acrylate such as butyl acrylate or other alcohol ester, and/or an amide such as acrylamide. The term "PSA" is used herein in its conventional sense to mean that the component is formulated has having a glass transition temperature, surface energy, and other properties such that it exhibits some degree of tack at normal room temperature. Acrylic hot-melt PSAs of such type are marketed commercially by Heartland Adhesives, Germantown, Wis., under the trade designations "H600" and "H251."

The α-olefinic thermoplastic component preferably is a polyolefin which may be characterized as a "low melt" composition. A representative material of the preferred type is an amorphous polymer of a $C_{10}$ or higher alkene which is marketed commercially by Petrolite Corporation, Tulsa, Okla., under the trade designation "VYBAR® 260."

By varying the ratio of the PSA to the thermoplastic component within the specified limits, the thermal and viscometric properties of the PCM formulation may be tailored to provide controlled thermal and viscometric properties. In particular, the phase transition temperature and melt flow index or viscosity of the formulation may be selected for optimum thermal performance with respect to such variables as the operating temperature of the heat generating electronic component, the magnitude of any applied external pressure, and the configuration of the interface. Generally, a phase transition temperature of between about 40-80° C. is considered typical for compound of the of the present invention.

In an alternative embodiment, a paraffinic wax or other natural or synthetic ester of a long-chain ($C_{16}$ or greater) carboxylic acid and alcohol having a melting temperature of from about 60-70° C. may be substituted for the thermoplastic and PSA components to comprise about 20-80% by weight of the formulation. A preferred wax is marketed commercially by Bareco Products of Rock Hill, S.C., under the trade designation "Ultraflex® Amber," and is compounded as a blend of clay-treated microcrystalline and amorphous constituents.

Additional fillers and additives may be included in the PCM formulation depending upon the requirements of the particular application envisioned. Such fillers and additives, which may be compounded with the PCM in a conventional mixing apparatus, may include conventional wetting agents or surfactants, opacifying or anti-foaming agents, chain extending oils, tackifiers, pigments, lubricants, stabilizers, flame retardants such as decabromodiphenyl oxide, antioxidants, thermally-conductive fillers, stabilizers, dispersants, flow modifiers, tackifiers, film-reinforcing polymers and other agents, and inert fillers such as fumed silica. The PCM formulation may be compounded with or without additional fillers and additives in a conventional mixing apparatus.

For optimal thermal performance, the PCM may be compounded with a conventional thermally-conductive particulate filler, particles of such filler being represented at 40 in the view 30 of FIG. 3. The filler typically will be included within the PCM in a proportion sufficient to provide the thermal conductivity desired for the intended application, and generally will be loaded at between about 20-80% by total weight of the PCM and filler. The size and shape of the filler is not critical for the purposes of the present invention. In this regard, the filler may be of any general shape including spherical, flake, platelet, irregular, or fibrous, such as chopped or milled fibers, but preferably will be a powder or other particulate to assure uniform dispersal and homogeneous mechanical and thermal properties. The particle size or distribution of the filler typically will range from between about 0.01-10 mil (0.25-250 em), but may further vary depending upon the thickness of layer 20. Suitable thermally-conductive fillers, which may be either electrically-conductive or non-conductive, include boron nitride, titanium diboride, aluminum nitride, silicon carbide, graphite, metals such as silver, aluminum, and copper, metal oxides such as aluminum oxide, magnesium oxide, zinc oxide, beryllium oxide, and antimony oxide, and mixtures thereof. Such fillers characteristically exhibit a thermal conductivity of about 25-50 W/m-K. For reasons of economy, an aluminum oxide, i.e., alumina, may be used, while for reasons of improved thermal conductivity a boron nitride would be considered more preferred. Loaded with the thermally-conductive filler, the PCM itself typically will exhibit a thermal conductivity, per ASTM D5470, of between about 0.1-5 W/m-K and a thermal impedance, also per ASTM D5470, of less than about 1° C.-in$^2$/W (6° C.-cm$^2$/W). As admixed with the filler, the PCM or other polymeric component generally forms a binder into which the filler particles are dispersed.

The dispersed component forming the domains 34 also is phase or state changing in being selected to be form-stable at normal room temperature, i.e., about 25° C., in a solid, semi-solid, glassy, or crystalline first phase or state, but as substantially conformable at an elevated temperature or temperature range in a liquid, semi-liquid, or otherwise viscous second phase or state. With the continuous phase component being formulated of the PCM as described, the layer 20 of the thermal interface pad 10 of the present invention advantageously is form-stable at normal room temperature such that pad 10 may be shipped, handled, cut or otherwise sized, and applied without appreciable slumping, sagging, or running. The phase transition temperature of the dispersed phase component, which may be its melting temperature from a form stable first phase to a flowable second phase, again is preferably between about 40-80° C., and may be tailored to fall within the operating temperature of most electronic components.

The dispersed phase component forming the domains 34 may be a second PCM, but for optimal thermal performance is provided to be a fusible, i.e., low melting point, metal or metal alloy of the type which is commonly used as solders and thermal links or fuses. Particularly, the dispersed phase may be one or more of such fusible metals, one or more of such fusible metal alloys, or a mixture or other combination of one or more fusible metals and one or more fusible metal alloys. Such metals and alloys typically have melting points, or melting ranges such as from a solidus temperature to a liquidus temperature, of between about 50-260° C. (124-500° F.), and usually contain one or more of bismuth, lead, tin, cadmium, and indium, but also may one or more other metals such as silver, zinc, copper, and antimony. Often, a eutectic alloy is formulated of a mixture of such metals, such eutectic having a definite melting point which may be lower in than that of each of the constituents of the mixture.

Representative fusible metals and metal alloys for the dispersed phase component include ASTM Alloy 117 (ASTM D5470) and, particularly, lead and cadmium-free alloys of bismuth, tin, and indium having a melting point of about 141° F. (61° C.). A particularly preferred alloy having a melting point of 141° F. (61° C.) is a eutectic of 32.5% bismuth, 16.5% tin, and 50% indium.

The fusible metals and metal alloys are included within the PCM or other polymeric constituent in a proportion sufficient to provide the thermal conductivity desired for the intended application, and generally will be loaded at between about 10-70% by total weight of the thermally-conductive compound. As shown in FIG. 3, within the first, form-stable, phase of the PCM or other matrix phase 32, the first phase of the dispersed fusible metals and/or metal alloys, or of such other dispersed component, will form the discrete domains 34. Typically, these domains 34 will have a diametric or other extent, referenced at "d" in FIG. 3, of between about 0.4-3 mils (10-75 μm) and, depend upon the degree of dispersion within the matrix 32, such domains 34 may form agglomerations having an extent, referenced at "D," of up to about 3 mils (75 μm) or more. As used herein, the term "discrete domains" should be understood to refer to either such domains individually or to the agglomerations thereof.

Following the heating of the layer 20 to a temperature which is above the phase transition temperature of each of the components, the domains 34 of the second, conformable phase of the dispersed fusible metals and/or metal alloys have been observed to form an emulsion with the second phase of the PCM or other matrix phase 32. Although the respective transition temperatures of the PCM and the fusible metals and metal alloys may be selected independently, for most formulations of the thermally-conductive compound of the present invention it will be preferred that the transition temperature of the PCM be lower, such as by at least about 5° C., than that of the fusible metals and alloys. In his regard, the compound may exhibit two distinct phase change temperatures, namely, a first order transition of the matrix phase constituent and a second order transition of the dispersed phase constituent. In contrast, it has been observed that in the case where the transition temperature of the PCM is higher than that of the fusible metals and metal alloys, there is the potential for the metal or alloy to coalesce, with an attendant reduction in thermal performance, or to flow out of the bondline with the result of a dry bondline and increased thermal resistance. Advantageously, however, by virtue of the PCM matrix, the overall melt flow viscosity of the emulsified melt of the compound may be maintained to be, for example, between about 10,000-100,000 cp (10-100 Pa-s) such that the melt is sufficiently viscous to remain in the bondline. Moreover, it has been observed that the addition of alumina, boron nitride, or other thermally-conductive filler particles to the PCM, although not required and in many applications not necessarily preferred, provides optimal thermal performance in that the filler particles may function as a thermal bridge between the domains 34 of the dispersed phase component giving the apparent effect of domain to domain contact along a thermal path or network.

Returning to FIGS. 2 and 3, in the production of commercial quantities of pad 10, the thermally-conductive compound of layer 20 may be compounded as an admixture of the polymeric components and, optionally, thermally-conductive particulate fillers, and the dispersed phase component under conditions of high shear in a roll mill or other mixer. In the case of the dispersed phase component being incorporated as one or more fusible metals and/or metal alloys, the metals and alloys may be introduced in the form of a bar, rod, ingot, pellet, powder, or the like, and admixed with the PCM under conditions of elevated temperature which exceed at least the phase transition temperature of the metals and alloys. After compounding, the admixture may be thinned with a solvent or other diluent or, in the case of a PCM formulation, heated to a temperature above the transition temperature of the PCM. Thereafter, a layer 20 of the compound may be coated on a release liner or other carrier strip or sheet, such as the liner referenced at 42 in FIGS. 1 and 2, in a conventional manner such as by, for example, spraying, knife coating, roller coating, casting, drum coating, dipping, dispensing, extrusion, screen printing, or other direct process, or by a transfer or other indirect process. After coating, the resultant layer 20 may be dried to flash the solvent or otherwise cured or cooled to develop an adherent film, coating, or other residue of the layer 20 on the release liner 42. As a result of the inherent tack of the PCM or the flow thereof, an adhesive and/or mechanical bond may be developed between the layer 20 and the liner 42. Alternatively, the layer 20 may be formed by coating on a substrate other than a liner, such as directly on one of the heat transfer surfaces.

Although not required, a carrier or reinforcement member (not shown in FIGS. 1 and 2) optionally may be incorporated within layer 20 as an interlayer therewithin or on one or both of the surfaces 12 and 14 to provide increased tear resistance. Conventionally, such member may be provided as a film formed of a thermoplastic material such as a polyimide or polyetheretherketone (PEEK), a layer of a woven or non-woven, e.g., needled, fiberglass fabric, cloth, web, or mat, or an aluminum or other metal foil, screen, or expanded mesh. Such reinforcement may improve the physical strength of the layer 20 and pad 10 to better facilitate handling at higher ambient temperatures and die cutting into a variety of geometries. The reinforcement member typically will have a thickness of between about 0.5-5 mil (12.5-125 µm), with a thickness of about 1-2 mils (25-50 µm) being preferred for metal foils.

To the extent that the PCM or other matrix component of the layer 20 is substantially non-tacky, i.e., having a dry or dead tack at room temperature, a separate PSA layer (not shown in FIGS. 1 and 2) may be provided on one or both of the surfaces 12 and 14 of layer 20 thereof as a coating or the like having a thickness, for example, of between about 0.05-2 mil (1.25-50 µm). Depending upon the composition or surface energy of the heat transfer surface to which pad 10 is to be applied, such PSA layer may be formulated as a silicone or acrylic-based PSA component or resin optionally blended with a thermally-conductive filler. The term "PSA" is used herein in its conventional sense to mean that the composition is formulated has having a glass transition temperature, surface energy, and other properties such that it exhibits some degree of tack at normal room temperature. Generally, the PSA material will be selected to exhibit a lap or die shear adhesion, according to ASTM D1002 or Chomerics Test Procedure No. 54 (Parker Chomerics Division, Woburn, Mass.), respectively, of at least about 100 psi (0.7 MPa) to the substrate. Such adhesion may be developed from valence forces, mechanical interlocking action, or a combination thereof.

The acrylic-based PSA component may be a homopolymer, copolymer, terpolymer, interpenetrating network, or blend of an acrylic or (meth)acrylic acid, an acrylate such as butyl acrylate or other alcohol ester, and/or an amide such as acrylamide. The silicone-based PSA component may include a dry or wet film silicone resin or gum. Depending upon the formulation, the respective acrylic or silicone-based PSA components may form a binder into which the thermally-conductive filler is dispersed. The filler generally is loaded in the binder in a proportion sufficient to provide the thermal conductivity desired for the intended application, and may be of the type described hereinbefore in connection with PCM of layer 20.

With continuing reference to FIGS. 1 and 2, as mentioned, layer 20 may be formed on a release liner 42 which thereupon covers the surface 14 of the layer. For ease of handling and/or as a protective layer for shipping, a second release liner, 44, may be laminated or provided over the PSA layer or, in the case of an inherent tacky PCM, over the other surface 12 of layer 20. Exemplary materials for either or both of the liners 42 and 44 include face stocks or other films of polyolefins, plasticized polyvinyl chloride, polyesters, cellulosics, metal foils, composites, and waxed, siliconized, or other coated paper or plastic having a relatively low surface energy to be removable without appreciable lifting of the layer 20 from the other liner or the substrate to which the layer may be applied. Depending upon the intended application and method of dispensing such as by pick-and-place or other automated dispensing means, kiss-cut pads 10, or continuous lengths of layer 20, may be carried, with or without covering liner 44, on a sheet or tape of liner 42, and supplied in the form of a sheet or roll. Alternatively, individual pads 10 may be die-cut from sheets of liner 42, again with or without liner 44.

Figure 4:
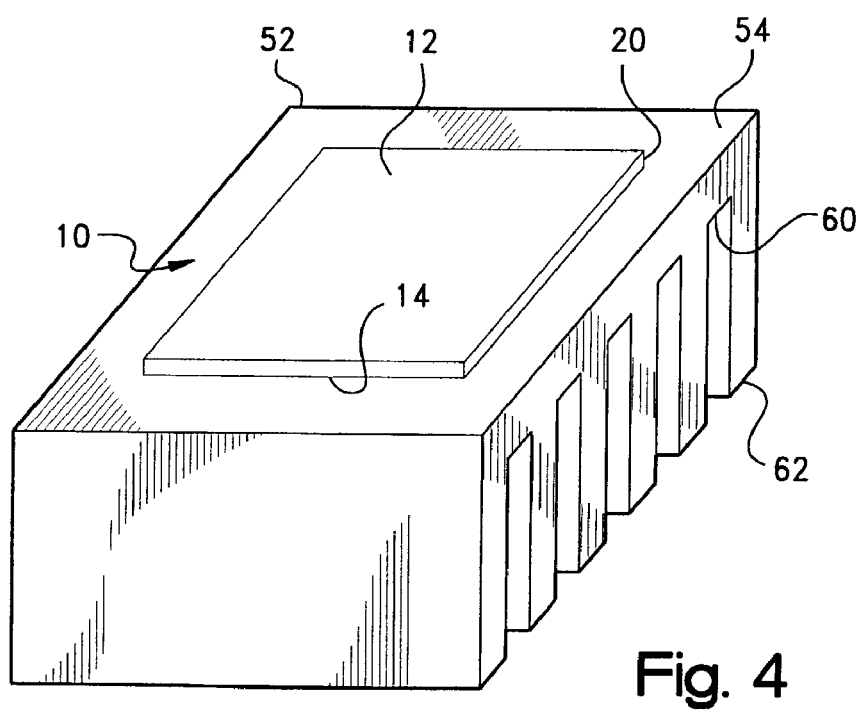
FIG. 4 is a perspective view showing the thermal interface of FIG. 1 as bonded to a plate-fin heat sink for use in a representative thermal management assembly.
Figure 5:
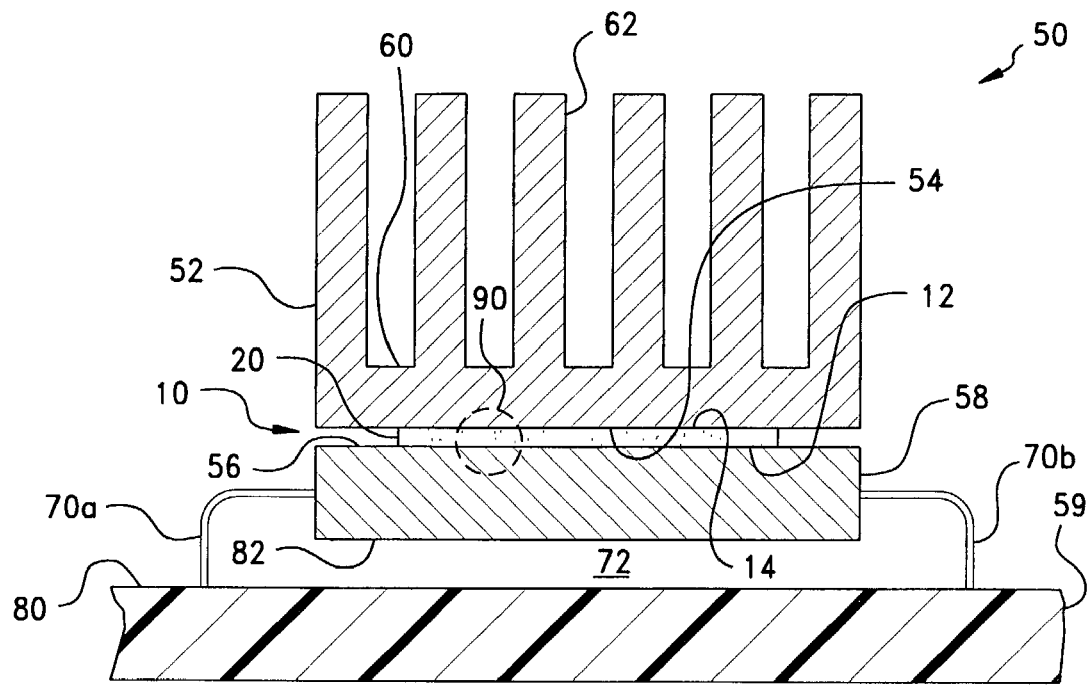
FIG. 5 is a cross-sectional view of a representative thermal management assembly wherein the heat sink and interface of FIG. 4 are disposed in heat transfer adjacency with a heat generating electronic component with the interface being interposed in conductive heat transfer contact with the heat sink and component to provide a low thermal impedance pathway therebetween.

Turning next to FIGS. 4 and 5, the use of pad 10 of the invention is illustrated in connection with the thermal management assembly referenced generally at 50 in FIG. 5 which includes a thermal dissipation member, 52, having a heat transfer surface, 54, which is disposed in conductive heat transfer adjacency with an opposing heat transfer surface, 56, of a heat-generating analog, digital, or other electronic component, 58, supported on an associated printed circuit board (PCB) or other substrate, 59. For illustrative purposes, thermal dissipation member 52 is shown to be a heat sink which may be of a plate-fin variety having a generally planar base portion, 60, from which extends a plurality of cooling fins, one of which is referenced at 62. Alternatively, thermal dissipation member 52 may be provided as a pin fin or other heat sink, heat exchanger, cold plate, or heat spreader structure, or even a printed circuit board, housing, or chassis. Dissipation member 52 typically will be formed of a ceramic material such as alumina, or a metal material such as aluminum or copper having a heat capacity relative to that of component 58 to be effective is dissipating thermal energy conducted or otherwise transferred therefrom.

With continuing reference to FIG. 5, electronic component 58 may be an integrated microchip, microprocessor, transistor, or other power semiconductor device, an ohmic or other heat-generating subassembly such as a diode, relay, resistor, transformer, amplifier, diac, or capacitor, or, alternatively, another heat-generating source. Typically, component 58 will have an operating temperature range of from about 60-100° C. For the electrical connection of component 58 to board 59, one or more pair of solder balls, leads, or pins, one pair of which is referenced at 70a-b, are provided as extending from component 58 into a soldered or other connection with board 59. Leads 70 additionally may support component 58 above board 59 to define a gap, represented at 72, of about 3 mils (75 microns) therebetween. Alternatively, component 58 may be received directly on board 59.

Returning to FIG. 4, with pad 10 removed from the liner 42 (FIGS. 1 and 2) removed to expose, in the case of an inherently tacky PCM, the surface 14 of layer 20, pad 10 may be adhered at room temperature and under a moderate applied pressure of between about 5-50 psi (35-350 kPa), or otherwise bonded or attached to the heat transfer surface 54 of the dissipation member 52. In this regard, and as aforementioned, pad 10 may be die or kiss-cut or otherwise sized from a larger sheet or from a roll or other length of tape stock. Typically, the margins of the applied pad 10 will be sized smaller than the area of the surface 54 or other surface to which the pad is applied to accommodate for an increase in the surface area coverage of the pad as the thickness thereof decreases under an applied pressure in the conformable phase of the layer 20.

With the applied pad 10, dissipation member 52 may be packaged and shipped, with the liner 44 covering the other surface 12 of the pad 10, as an integrated unit to an electronics manufacturer, assembler, or other user. The user then simply may remove the liner 44 to expose the surface 12 of layer 20, position the exposed surface 12 on the heat transfer surface 56 of electronic component 58, and, lastly, apply a clip, clamp, screw, or other another means of external pressure (not shown) to dispose the dissipation member 52 in thermal adjacency with the component 58 as is shown in FIG. 5.

With continuing reference to FIG. 5, within assembly 50, pad 10 provides a low impedance conductive pathway for the transfer of heat from component 58 to dissipation member 52. Such pathway may be employed without or in conjunction with convective air circulation for effecting the cooling of component 58 and ensuring that the operating temperature thereof is maintained below specified limits. Although thermal dissipation member 52 is shown to be a separate heat sink member, board 59 itself may be used for such purpose by alternatively interposing pad 10 within the gap 72 between an upper surface, 80, of the board 59 thereof and an opposing surface, 82, of the electronic component 58.

As mentioned, the thermally-conductive compound of layer 20 may be formulated to be form-stable at normal room temperature, i.e., about 25° C., in a first phase of the PCM and of the fusible metal and/or metal alloy constituents, which is solid, semi-solid, glassy, or crystalline, but to be substantially conformable in service in a second phase thereof, which second phase is a liquid, semi-liquid, or otherwise viscous melt, between the heat transfer surfaces 54 and 56. More specifically, the respective phase transition temperatures of the PCM and fusible metals and alloys each preferably is between about 40-80° C., and generally is tailored to fall within the operating temperature of electronic component 58.

Figures 6A, 6B:
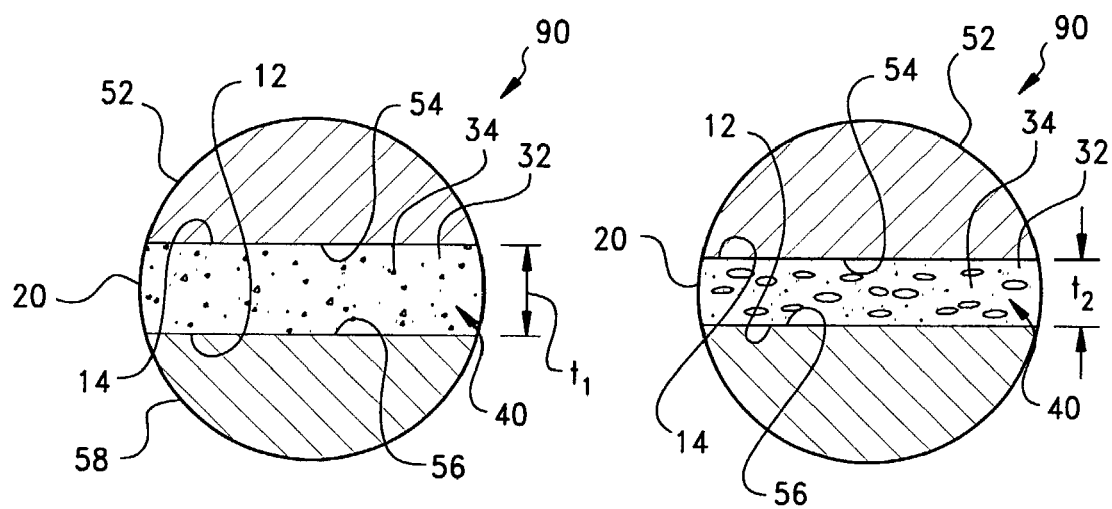
FIG. 6A is a magnified view of a portion of the interface pad of FIG. 5 showing the morphology thereof prior to phase change in enhanced detail.
FIG. 6B is a magnified view as in FIG. 6B showing the morphology the interface pad of FIG. 5 after phase change.

Further in this regard, reference may be had to FIG. 6A wherein an enlarged view of the region referenced at 90 in FIG. 5 is shown to detail the morphology thereof prior to heating by the energization of electronic component 58. As may be seen, prior to heating, the bondline between the heat transfer surfaces 54 and 56 defines a thickness, referenced at $t_1$, which is filled by the form-stable first phase of the layer 20 of the thermal compound of pad 10 of the present invention. In such phase, the domains 34 of the fusible metal or metal alloy constituent may be seen to assume in the somewhat stylized representation of FIG. 6A a generally spherical geometry within the matrix 32.

As may be seen with reference next to depiction at 90' shown in FIG. 6B, upon heating and the resultant phase change of the matrix 32 and the dispersed domains 34 into their conformable second phases, each of the matrix and dispersed domain constituents are conformable to fill the thickness, now referenced at $t_2$, between the surfaces 54 and 56. The thickness $t_2$ may be reduced, such as by an applied external pressure developed from a spring clip or the like, by about 50-80% or more as compared to the thickness $t_1$, with a corresponding increase in the surface area of pad 10 which thereby may flow to substantially fill the margins of the bondline gap between the surfaces 54 and 56.

Further in this regard, the domains 34 may be seen to assume a flattened, more ellipsoidal geometry within the viscous melt of the second phase of the matrix 32. Overall, such second phase of the compound of layer 20 provides increased surface area contact with the heat transfer surfaces 52 and 54 for the displacement of air therefrom and the better exclusion of air pockets or other voids with a resultant improvement in both the efficiency and the rate of heat transfer through the pad 10. Moreover, as depending on, for example, the melt flow index or viscosity of the PCM and the magnitude of any externally-applied pressure such as from a clamp or clip, the interface gap between the surfaces 54 and 56 may be closed from, for example, the thickness $t_1$ of FIG. 6A to the to a minimum bondline thickness, such as represented by $t_2$, of the compound of layer 20 to further improve the efficiency of the thermal transfer therebetween. The latent heat effects associated with the phase change of the matrix and domain constituents additionally contributes to the cooling of the electronic component 58.

The Examples to follow, wherein all percentages and proportions are by weight unless otherwise expressly indicated, are illustrative of the practicing of the invention herein involved, but should not be construed in any limiting sense.

EXAMPLES

Example 1

In a first representative formulation, about 70% by total weight of a fusible metal ASTM Alloy 117 was dispersed in a boron nitride (BN)-filled PCM compound (30% BN in a polymeric binder, Thermflow® T454, Chomerics Division, Parker Hannifin Corp., Woburn, Mass.) by admixing the two components which were heated to a temperature of about 60-70° C. In the blend so formed, the alloy was observed to form a dispersed phase of discrete domains and agglomerations thereof within a continuous matrix phase of the BN-filled PCM.

The Thermflow® T454 PCM compound itself was reported as having a phase change temperature of about 43° C., a thermal impedance of about 0.025° C.-in$^2$/W (0.63° C.-cm$^2$/W) at about 90 psi (620 kPa), and an apparent thermal conductivity of about 0.7 W/m-K.

As to the alloy, such 117 alloys are specified per ASTM B774 as eutectics having a melting point of 117° F. (47° C.) and comprising between 44.2-45.2% bismuth, 22.1-23.2% lead, 7.8-8.8% tin, 18.6-19.6% indium, and 4.8-5.8% cadmium. The specific alloy used in this Example 1 was 44.7% bismuth, 22.6% lead, 8.3% tin, 19.1% indium, and 5.3% cadmium (AIM47, AIM, Montreal, Quebec, Canada). This alloy was reported as having a an apparent thermal conductivity of about 20 W/m-K.

The PCM compound-fusible metal alloy admixture was formed by coating into a 5 mil (125 μm)-thick sheet for thermal characterization. Thermal impedance was determined according to ASTM D5470 at an applied pressure of 50 psi (345 kPa) and a minimum bondline thickness (MBLT) of about 1 mil (25 μm).

Thermal resistance was determined using a thermal module tester designed to be representative of a typical "real world" application. A ½-inch by ½-inch (12.7 mm by 12.7 mm) pad was cut from the sheet so prepared and applied to the bottom surface of a 2-inch by 2-inch (5.1 cm by 5.1 cm) fan heat sink. The heat sink and pad were surface mounted using a clip under an application pressure of less than about 5 psi (35 kPa) to an Intel® Pentium® III microprocessor chip. Differential temperature measurements were obtained using thermocouples attached to the die case of the chip and to the heat sink, with the ambient temperature within the computer also being measured. At steady-state, i.e., after about 25 minutes, final temperature measurements were recorded.

Both of thermal impedance and thermal resistance values measured were found to be improved over those for the same thickness of the T454 compound without the addition of the fusible metal alloy, and over a representative silver-filled PCM compound (Thermflow® T488, Parker Chomerics Division, phase change temperature of about 45° C., apparent thermal conductivity of 3 W/m-K). The results are summarized in Table 1 below.

TABLE 1

| Sample | Description | Thermal Impedance ° C.-in²/W | Thermal Impedance ° C.-cm²/W | Thermal Resistance ° C./W |
|---|---|---|---|---|
| 1 | T454 (BN-filled) | 0.023 | 0.58 | 0.66 |
| 2 | T488 (Ag-filled) | 0.025 | 0.63 | 0.45 |
| 3 | T454 + AIM47 | 0.012 | 0.30 | 0.30 |

These data of Table 1 show that that a PCM-fusible metal alloy compound formulated according to the present invention exhibits improved thermal performance over conventionally-filled PCM compounds.

Example 2

In a second representative formulation, the BN-filled Thermflow® T454 PCM compound was admixed with about 70% by total weight of another fusible metal alloy (METSPEC™ 141 ("MS 141"), MCP Metalspecialties, Fairfield, Conn.). The lead and cadmium-free alloy used in this Example 2 was a eutectic of 32.5% bismuth, 16.5% tin, and 50% indium, and had a melting point of 141° F. (61° C.). This alloy was reported as having a an apparent thermal conductivity of about 20 W/m-K.

As in Example 1, the PCM compound-fusible metal alloy admixture of this Example 2 was formed by coating into a 5 mil (125 μm)-thick sheet for thermal characterization. Thermal impedance again was determined according to ASTM D5470 at an applied pressure of about 90 psi (620 kPa) and a minimum bondline thickness (MBLT) of about 1 mil (25 μm). The results are summarized in Table 2 below as compared to reported values for the Thermflow® T454 material itself and for a standard silicone thermal grease (Dow Corning® 340 Heat Sink Compound, Dow Corning Corp., Midland, Mich.).

TABLE 2

| Material | Thermal Impedance ° C.-in²/W | Thermal Impedance ° C.-cm²/W |
|---|---|---|
| T454 + MS 141 | 0.011 | 0.27 |
| T454 | 0.025 | 0.63 |
| Silicone grease | 0.182 | 4.59 |

These data of Table 2 again confirm that that a PCM-fusible metal alloy compound formulated according to the present invention exhibits improved thermal performance over conventionally-filled PCM compounds.

Thermal resistance (θ) also again was determined in the manner described in Example 1. As before, differential temperature measurements were obtained using thermocouples attached to the die case of the chip ($T_{case}$) and to the heat sink ($T_{sink}$, with the ambient temperature ($T_{ambinet}$) within the computer also being measured. At a steady-state of after about 25 minutes, final temperature measurements were recorded. The power input to the processor also was recorded. The test was performed at 2 different MBLT's. The results, wherein all temperatures are given in ° C. and all θ's in ° C./W, are compiled in Table 3 below as compared to the performance of T454 compound without the addition of a fusible metal or metal alloy.

TABLE 3

| Sample | Thickness mils (μm) | Power (W) | $T_{die}$ | $T_{sink}$ | $\theta_{die-sink}$ | $\theta_{die-ambient}$ |
|---|---|---|---|---|---|---|
| T454 + MS 141 | 1 (25.4) | 23.0 | 78.8 | 73.0 | 0.25 | 2.44 |
| T454 + MS 141 | 2 (50.8) | 23.0 | 77.9 | 71.7 | 0.27 | 2.45 |
| T454 | 1 (25.4) | 22.4 | 88.0 | 73.2 | 0.66 | 2.90 |
| T454 | 2 (50.8) | 22.4 | 88.5 | 71.8 | 0.75 | 2.90 |

In the thermal resistance test of Table 3, lower die temperatures are indicative of improved thermal performance. These results show that the PCM-fusible metal alloy blend of the present invention, as compared to the unblended PCM, exhibits an actual reduction in die temperature in excess of 9° C. with an increase in power input to the die of 0.6 W. Thus, in an actual application within a personal computer or other electronic device, it is believed that thermal interface materials formulated in accordance with the present invention would be expected to offer the ability to operate these devices at high power performance levels while maintaining low operation temperatures of the electronic components.

As it is anticipated that certain changes may be made in the present invention without departing from the precepts herein involved, it is intended that all matter contained in the foregoing description shall be interpreted as illustrative and not in a limiting sense. All references including any priority documents cited herein are expressly incorporated by reference.

What is claimed is:

1. A thermally-conductive interface interposable intermediate a first heat transfer surface and an opposing second heat transfer surface to provide a thermal pathway therebetween, said interface comprising a thermally-conductive compound formed into a layer which is conformable between the first and second heat transfer surface, said compound comprising an admixture of:
 (a) a polymeric constituent forming a continuous matrix in said layer, said matrix being form-stable at normal room temperature in a first matrix phase and conformable between the first and second heat transfer surface in a second matrix phase, and said matrix having a matrix melting or glass transition temperature above normal room temperature from said first matrix phase to said second matrix phase; and
 (b) a dispersed constituent forming discrete domains within said matrix, said domains being form-stable at normal room temperature in a first domain phase and conformable between the first and second heat transfer surface in a second domain phase, and said domains having a domain melting temperature above normal room temperature from said first domain phase to said second domain phase, said domain melting temperature being between about 40-80° C.

2. The interface of claim 1 wherein:
the first heat transfer surface is located on a heat-generating source having an operating temperature range above normal room temperature; and
said domain melting temperature is within the operating temperature range said heat-generating source.

3. The interface of claim 2 wherein:
said heat-generating source is an electronic component; and
the second heat transfer surface is located on a thermal dissipation member.

4. The interface of claim 3 wherein the thermal dissipation member is a heat sink or a circuit board.

5. The interface of claim 1 wherein said polymeric constituent is inherently tacky such said layer is adherable to one or both of the first or second heat transfer surface.

6. The interface of claim 1 wherein said matrix melting or glass transition temperature is lower than the domain melting temperature.

7. The interface of claim 6 wherein said matrix melting or glass transition temperature is at least about 5° C. lower than said domain melting temperature.

8. The interface of claim 1 wherein said domains in said second domain phase and said matrix in said second matrix phase form an emulsion in said layer.

9. The interface of claim 1 wherein said polymeric constituent comprises one or more resins, one or more waxes, or a combination thereof.

10. The interface of claim 9 wherein said one or more resins or waxes is selected from the group consisting of thermoplastics, pressure sensitive adhesives, paraffinic waxes, and blends thereof.

11. The interface of claim 1 wherein said domains have a mean average size of between about 0.4-3 mils (10-75 μm).

12. The interface of claim 1 wherein said compound further comprises:
(c) a thermally-conductive particulate filler constituent admixture with said polymeric constituent.

13. The interface of claim 12 wherein said thermally-conductive particulate filler constituent is selected from one or more of the group consisting of metal or non-metal oxide, nitride, carbide, or diboride particles, graphite particles, metal particles, and mixtures thereof.

14. The interface of claim 13 wherein said compound comprises, by total weight of the constituents (a) and (b), between about 20-80% of said thermally-conductive particulate filler constituent.

15. The interface of claim 13 wherein said thermally-conductive particulate filler constituent has a particle size of between about 0.01-10 mil (0.25-250 μm).

16. The interface of claim 13 wherein said thermally-conductive particulate filler constituent has a thermal conductivity of between about 25-50 W/m-K.

17. The interface of claim 1 wherein said layer has a thermal impedance of less than about 0.02° C.-in$^2$/W (0.12° C.-cm$^2$/W).

18. The interface of claim 1 wherein said layer has a thermal conductivity of at least about 0.7 W/m-K.

19. The interface of claim 1 wherein said layer has a thickness of about 5 mils (125 μm) or less.

20. The interface of claim 1 wherein said layer is form-stable at normal room temperature.

21. The interface of claim 1 wherein said dispersed constituent comprises one or more fusible metals, one or more fusible metal alloys, or a combination thereof.

22. The interface of claim 9 wherein said dispersed constituent comprises one or more fusible metals, one or more fusible metal alloys, or a combination thereof.

23. The interface of claim 22 wherein said domains in said second domain phase and said matrix in said second matrix phase form an emulsion in said layer.

24. The interface of claim 23 wherein:
the first heat transfer surface is located on a heat-generating source having an operating temperature range above normal room temperature; and
said emulsion has a melt flow viscosity of between about 10,000-100,000 cp (10-100 Pa-s) within the operating temperature range of the heat generating source.

* * * * *